(12) United States Patent
Jaffe et al.

(10) Patent No.: US 9,276,148 B2
(45) Date of Patent: Mar. 1, 2016

(54) THERMALLY EFFICIENT POWER CONVERSION MODULES FOR SPACE SOLAR POWER

(75) Inventors: Paul I. Jaffe, Springfield, VA (US); Michael W. Nurnberger, Springfield, VA (US); Michael A. Brown, Columbia, MD (US)

(73) Assignee: The United States of America, as represented by the Secretary of the Navy, Washington, DC (US)

( * ) Notice: Subject to any disclaimer, the term of this patent is extended or adjusted under 35 U.S.C. 154(b) by 805 days.

(21) Appl. No.: 13/528,800

(22) Filed: Jun. 20, 2012

(65) Prior Publication Data

US 2013/0099599 A1     Apr. 25, 2013

Related U.S. Application Data

(60) Provisional application No. 61/498,900, filed on Jun. 20, 2011.

(51) Int. Cl.
| | |
|---|---|
| *G05F 3/06* | (2006.01) |
| *H01L 31/042* | (2014.01) |
| *H02J 17/00* | (2006.01) |
| *H01L 31/052* | (2014.01) |
| *H01L 31/054* | (2014.01) |

(52) U.S. Cl.
CPC .......... *H01L 31/0424* (2013.01); *H01L 31/052* (2013.01); *H01L 31/0547* (2014.12); *H02J 17/00* (2013.01); *Y02B 10/10* (2013.01); *Y02E 10/52* (2013.01)

(58) Field of Classification Search
CPC ............. H02J 17/00; H02J 3/383; H02J 1/00; H02J 5/00; Y02E 10/52; Y02E 10/544; Y10T 307/707

USPC ................................................. 307/105, 151
See application file for complete search history.

(56) References Cited

U.S. PATENT DOCUMENTS

| | | | | |
|---|---|---|---|---|
| 4,415,759 | A * | 11/1983 | Copeland et al. ............. | 136/246 |
| 2008/0000232 | A1* | 1/2008 | Rogers et al. ............. | 60/641.15 |

OTHER PUBLICATIONS

Jaffe, P.; Pasour, J.; Gonzalez, M.; Spencer, S.; Nurnberger, M.; Dunay, J.; Scherr, M; Jenkins, P., "Sandwich Module Development for Space Solar Power", Space, Propulsion & Energy Sciences International Forum, College Park, MD, Mar. 2011, [online], [retrieved on Jan. 25, 2012] <URL: http://www.propagation.gatech.edu/ECE6390/project/Fall2011/papers/Sandwich Module Development NRL_Jaffe 2011.pdf>.

Jaffe, P., "A Study of Defense Applications of Space Solar Power", AIP Conf. Proc., Space, Propulsion & Energy Sciences International Forum SPESIF 2010, vol. 1208, pp. 585-592, conference date Feb. 23-25, 2010.

(Continued)

*Primary Examiner* — Carlos Amaya
(74) *Attorney, Agent, or Firm* — US Naval Research Laboratory; Sally A. Ferrett

(57) ABSTRACT

A space solar power system that has sun-tracking curved reflectors, such as off-axis parabolic reflectors, a secondary reflector, and a power conversion module for converting the sunlight into microwave energy and transmit the energy to remote locations. The power conversion module can have a modular stepped conical shape, with additional radiator area configured in vertical sidewalls, horizontal radiator panels, or both. Hinged, fold-out units can house the microwave conversion electronics and the antenna for transmitting the microwave radiation to the remote ground station.

12 Claims, 11 Drawing Sheets

(56) References Cited

OTHER PUBLICATIONS

Jaffe, P.; Hodkin, J.; Harrington, F.; "Development of a sandwich module prototype for space solar power." Aerospace Conference, 2012 IEEE, pp. 1-9, conference date Mar. 3-10, 2012.

Brown, W.C.; Eves, E.E.; "Beamed Microwave Power Transmission and its Application to Space", IEEE Transactions on Microwave Theory and Techniques, vol. 40, No. 6, pp. 1239-1250, Jun. 1992.

Cornfeld, A. B.; Aiken, D.; Cho, B.; Ley, A.V.; Sharps, P.; Stan, M.; Varghese, T.; "Development of a 4-subcell inverted metamorphic multi-junction (IMM) highly efficient AM0 solar cell", Proc. of the 35th IEEE Photovoltaic Specialist Conference, Honolulu, HI, conf. date Jun. 20-25, 2010, pp. 000105-000109, (Jun. 2010).

Johnson, W.N. et al., "Space-based Solar Power: Possible Defense Applications and Opportunities for NRL Contributions", NRL/FR/7650-09-10, pp. 1-105, Oct. 2009.

Stan, M. A.; Sharps, P. R.; Fatemi, N. S.; Spadafora, F.; Aiken, D.; Hou, H. Q.; "Design and Production of Extremely Radiation Hard 26% InGaP/GaAs/Ge Triple Junction Solar Cells", Anchorage, Alaska, USA, Proc. of 28th IEEE Photovoltaic Specialist Conference, p. 1374-77 (2000).

URSI Inter-communication Working Group on SPS, "URSI White Paper on Solar Power Satellite Systems", Radio Science Bulletin, No. 321, pp. 13-27, (Jun. 2007).

URSI Inter-communication Working Group on SPS, Supporting Document for the URSI White Paper on Solar Power Satellite Systems, pp. 1-60, (Jun. 2007).

* cited by examiner

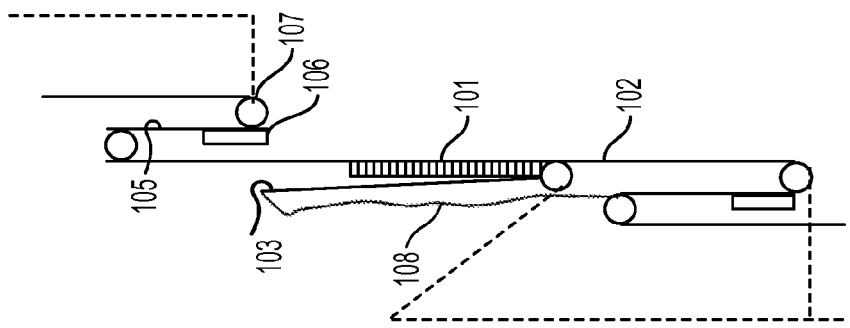
FIG. 8B STOWED POSITION
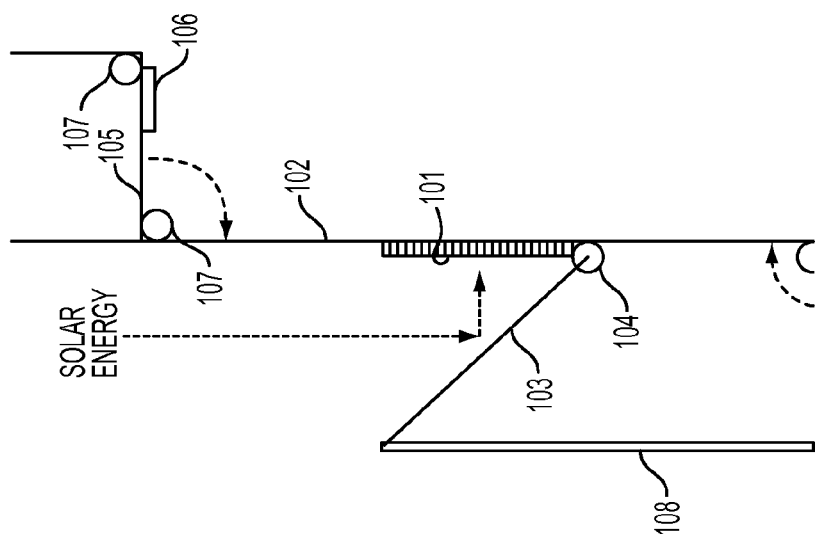
FIG. 8A DEPLOYED POSITION

THERMALLY EFFICIENT POWER CONVERSION MODULES FOR SPACE SOLAR POWER

CROSS-REFERENCE TO RELATED APPLICATIONS

This application is a non-provisional application under 35 USC 119(e) of, claims priority to, and claims the benefit of U.S. Provisional Application 61/498,900 filed on Jun. 20, 2011, the entire disclosure of which is incorporated by reference herein.

BACKGROUND

1. Technical Field

The invention is related to solar power, and more particularly, to modules for converting incident optical radiation to microwave radiation and transmitting the microwave radiation.

2. Related Technology

Space solar power systems have been contemplated since the 1960s, for collecting the sun's solar energy and transmitting it to earth. Early concepts involved large sun-tracking photovoltaic arrays feeding power to a separate microwave conversion and transmitting module. As contemplated, these systems required power cabling for the low voltage current from the photovoltaic array and a gimbaled connection between the photovoltaic array and the microwave module.

A NASA/DOE space solar power concept circa 1980 proposed using a photovoltaic (PV) array of multi-kilometer dimension to supply electrical power to an antenna system that would convert the power to microwaves and beam it to earth. The PV array was proposed to track the sun while the antenna would track the receiver on earth. This design, while promising, had several difficulties. First, a large mass of copper wiring would be needed to carry low voltage current and transfer the current through slip rings. Second, a large supporting structure would be required for the flat PV array. Third, time consuming handwork by a number of astronauts would be needed to complete the on-orbit assembly.

Another concept known as the "Integrated Symmetrical Concentrator" proposed using a two-axis reflector array that tracks the sun continuously to direct sunlight in a nadir direction to a single compact module, called a sandwich cell array. This system allows two-axis sun tracking while the microwave antennas remain pointing toward the earth. The sandwich cell array combines a photovoltaic array, electric to microwave conversion, and nadir-directed microwave transmission. PV and microwave systems are back-to-back in the "sandwich" power conversion module, eliminating long power cables and slip rings. Solar concentration reduces the number of PV cells. However, waste heat from PV and microwave devices creates high temperatures that significantly reduce system efficiency. Further, the problems of structural mass to maintain the flat disc module, and on-orbit assembly of module, remain.

BRIEF DESCRIPTION OF THE DRAWINGS

FIGS. 8A and 8B show an alternative configuration for the conical power conversion module.

DETAILED DESCRIPTION OF THE DISCLOSURE

Figure 1:
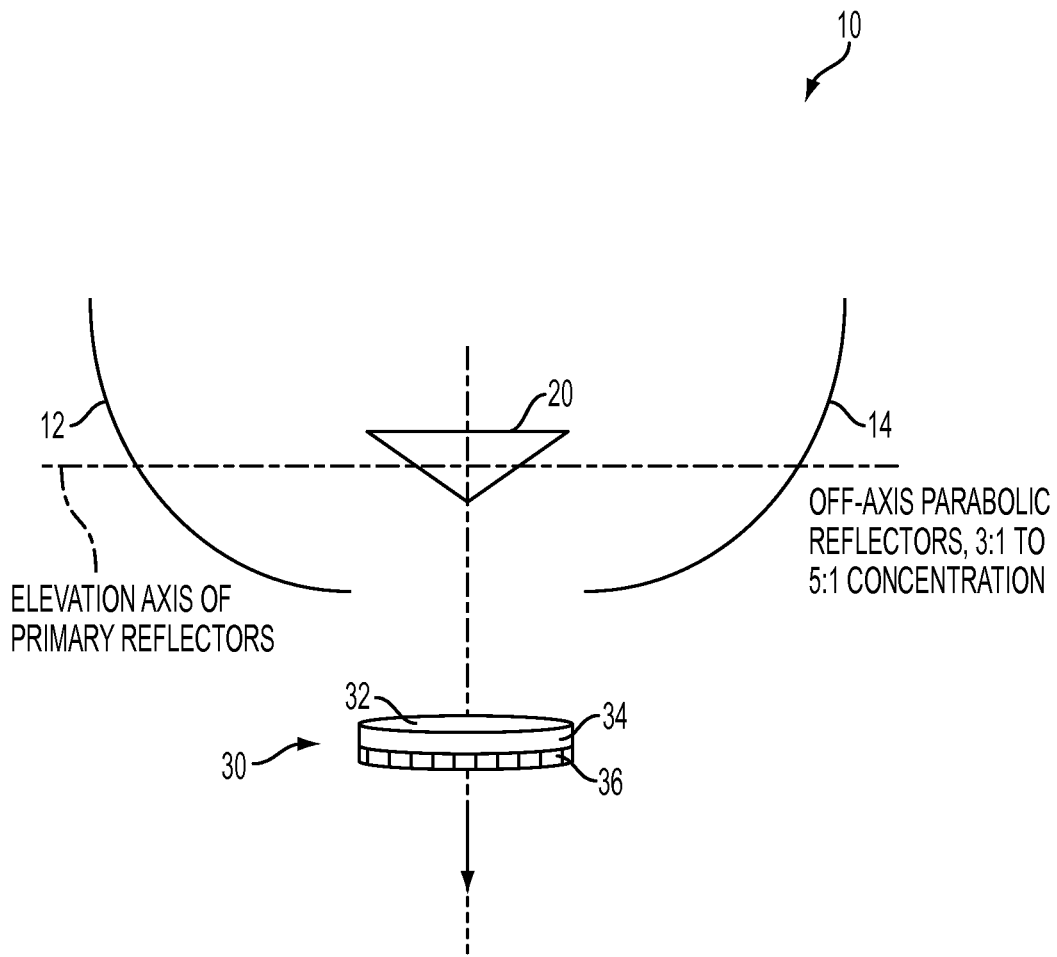
FIG. 1 is a schematic illustration of a space-solar power system that includes a sandwich power conversion module.

FIG. 1 illustrates an exemplary solar power system 10 for use in space in accordance with an embodiment of the invention.

Curved reflectors 12 and 14 are on azimuth/elevation axes to track the sun in any location and direct the sunlight to the secondary reflector module 20. The reflective surfaces of the secondary reflector module reflect the concentrated solar energy toward the power conversion module 30. The power conversion module 30 converts the solar energy into RF energy and transmits the RF energy toward the ground station below.

The curved reflectors 12 and 14 can be off-axis parabolic reflectors, with the curvature of the reflectors matching that of an off-axis segment of a parabola, e.g., a segment of the parabola that is not on the axis of symmetry of the parabola.

The curved reflectors 12 and 14 are arranged on two opposite sides of the secondary reflector unit 20, with the secondary reflector positioned between them at a distance that allows a large amount of the sunlight reflected by the reflectors 12 and 14 to strike the secondary reflector's mirrored surfaces 22 and 24.

The power conversion module 30 is configured to receive sunlight from the secondary reflector unit 20, and to convert it to microwave energy for transmission to a remote location, such as on earth.

The system 10 can be launched into geosynchronous orbit, to provide constant ground coverage. A support structure (not shown) can keep the primary curved minors, the secondary curved minor, and the power conversion module aligned with respect to each other. The support structure can be, for example, a series of lightweight longeron trusses. Alternatively, several satellites flying in formation can keep the system components in alignment.

The power conversion module or "sandwich module" 30 has three main components including a photovoltaic array layer 32 for receiving the concentrated sunlight from the reflectors, a DC-RF conversion electronics for converting the DC electrical power to an RF frequency suitable for transmission and antennas for transmission of the RF power. The DC-RF conversion electronics and the antennae can be combined in a layer 36, with a structural layer 34 providing the interface between the PV array and the conversion electronics.

Although a variety of photovoltaic materials can be used in the photovoltaic array layer 32, the preferred materials are current state of the art III-V multijunction solar cell technology. In these devices, materials of different III-V bandgaps are combined, enabling an efficient capture and conversion of a wide range of the solar spectrum. Due to the high absorption coefficient displayed by most III-V materials, such efficient conversion of light occurs in a considerably reduced material thickness when compared with other PV materials. As one example, Silicon (Si) III-V multijunction solar cells efficiencies have previously been demonstrated to reach values of 34% under one-sun AM0 (space) conditions and over 42% in terrestrial concentrator systems, in which lenses and mirrors are used to focus sunlight into a small area cell. Currently, commercially available triple junction GaInP/GaAs/Ge solar cells are used in the space PV market with AM0 efficiencies up to 29.5%. In addition to their enhanced optical conversion capabilities, III-V materials display a far superior resistance to damage induced by radiation present in space when compared to other currently available PV technologies. This aspect is important for long lasting missions since PV space arrays are preferably designed to consider both beginning-of-life and end-of-life (EOL) performance, as well as a manageable power profile for the duration of a given space mission. See Cornfeld, A. B., Aiken, D., Cho, B., Ley, A. V., Sharps, P., Stan, M. and Varghese, T., "Development of a 4-subcell inverted metamorphic multi-junction (IMM) highly efficient AM0 solar cell", Proc. of the 35th IEEE Photovoltaic Specialist Conference, Honolulu, Hi., (2010) and Stan, M. A., Sharps, P. R., Fatemi, N. S., Spadafora, F., Aiken, D. and Hou, H. Q., "Design and Production of Extremely Radiation Hard 26% InGaP/GaAs/Ge Triple Junction Solar Cells", Anchorage, Ak., USA, Proc. of 28th IEEE Photovoltaic Specialist Conference, p. 1374-1377 (2000) for more information related to these materials.

Additional information related to sandwich power conversion modules is found in P. Jaffe, J. Hodkin, F. Harrington, "Development of a Sandwich Module Prototype for Space Solar Power", 2012 IEEE Aerospace Conference, pages 1-9, conference dates 3-10 Mar. 2012, and in P. Jaffe, J. Pasour, M. Gonzalez, S. Spencer, M. Nurnberger, J. Dunay, M. Scherr, and P. Jenkins, "Sandwich Module Development for Space Solar Power", International Space Solar Power Symposium, National Space Society, May 2011, each of which is incorporated herein in its entirety.

Other considerations for selecting a photovoltaic technology include availability, temperature performance characteristics, concentration ratio tolerance, power output per unit mass ratio, and high voltage capabilities.

Figure 2:
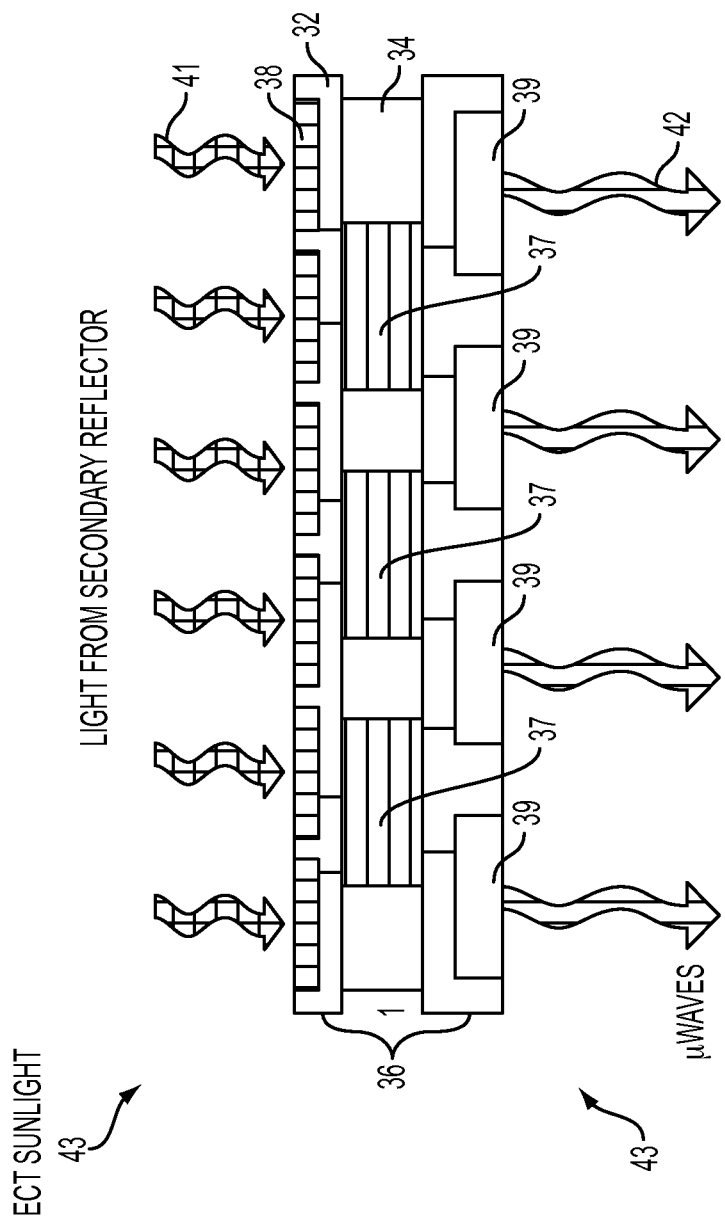
FIG. 2 illustrates the sandwich power conversion module of FIG. 1 in more detail.

FIG. 2 shows a cross sectional view of the power conversion sandwich module 30 in more detail in operation. The concentrated sunlight 41 from the secondary reflector strikes the photovoltaic cells 38 of the photovoltaic array layer 32. The photovoltaic cells in the array preferably cover almost 100% of the surface area of the sandwich power conversion module facing the secondary reflector. The DC-RF conversion electronics 37 convert the DC electrical power from the photovoltaic cells to an RF frequency suitable for transmission. The antennae 39 transmit the RF power 42 toward the ground based ground stations. The DC-RF converters and microwave antennae are preferably distributed approximately evenly over the opposite surface of the module, in order to minimize heat build-up, and preferably have a "high-e", or high-emissivity, coating to reflect sunlight.

An exemplary system might have a sunlight concentration factor of 3, a module area of 0.36 square meters, a photovoltaic efficiency of 28% (with current PV III-V multijunction cells), a DC to RF conversion efficiency of 60%, a power distribution and control subsystem efficiency of 95%, and antenna efficiency of 90%, resulting in a power conversion module efficiency of 23%, and an overall system efficiency of 14%. The 28% efficiency factor for photovoltaics is estimated based on currently available commercial multijunction photovoltaic cells. Note that if the efficiency of commercial III-V multijunction cells were to increase to 33%, the overall system efficiency would improve from 14% to 17%.

The heat load that must be dissipated from the power conversion module include a portion of the direct sunlight 43 incident on the module, a portion of the solar energy 41 from the secondary reflector, and the heat generated by the module itself.

Figure 3:
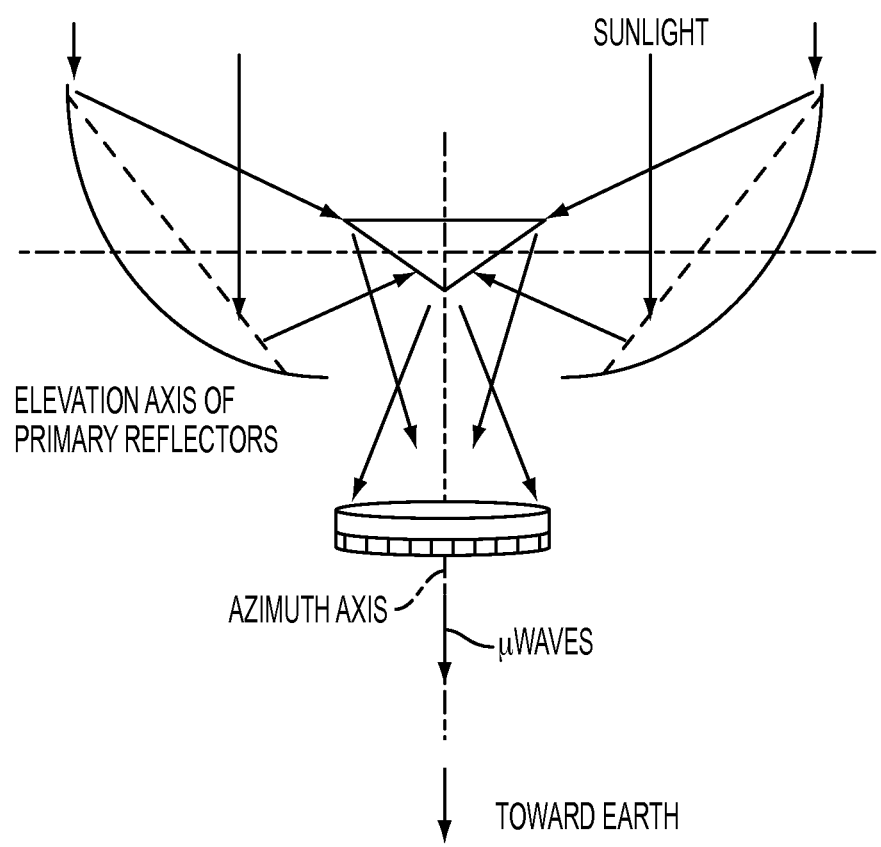
FIG. 3 illustrates operation of the space solar power system.

FIG. 3 illustrates the space solar power system 10 in operation. The curved reflectors 12 and 14 track the sun, and direct the sunlight to a secondary reflector unit 20, which reflects the sunlight toward the power conversion module. The power conversion module 30 receives the sunlight from the secondary reflector unit 20 and converts it to microwave energy for transmission to a ground station.

Figure 4A:
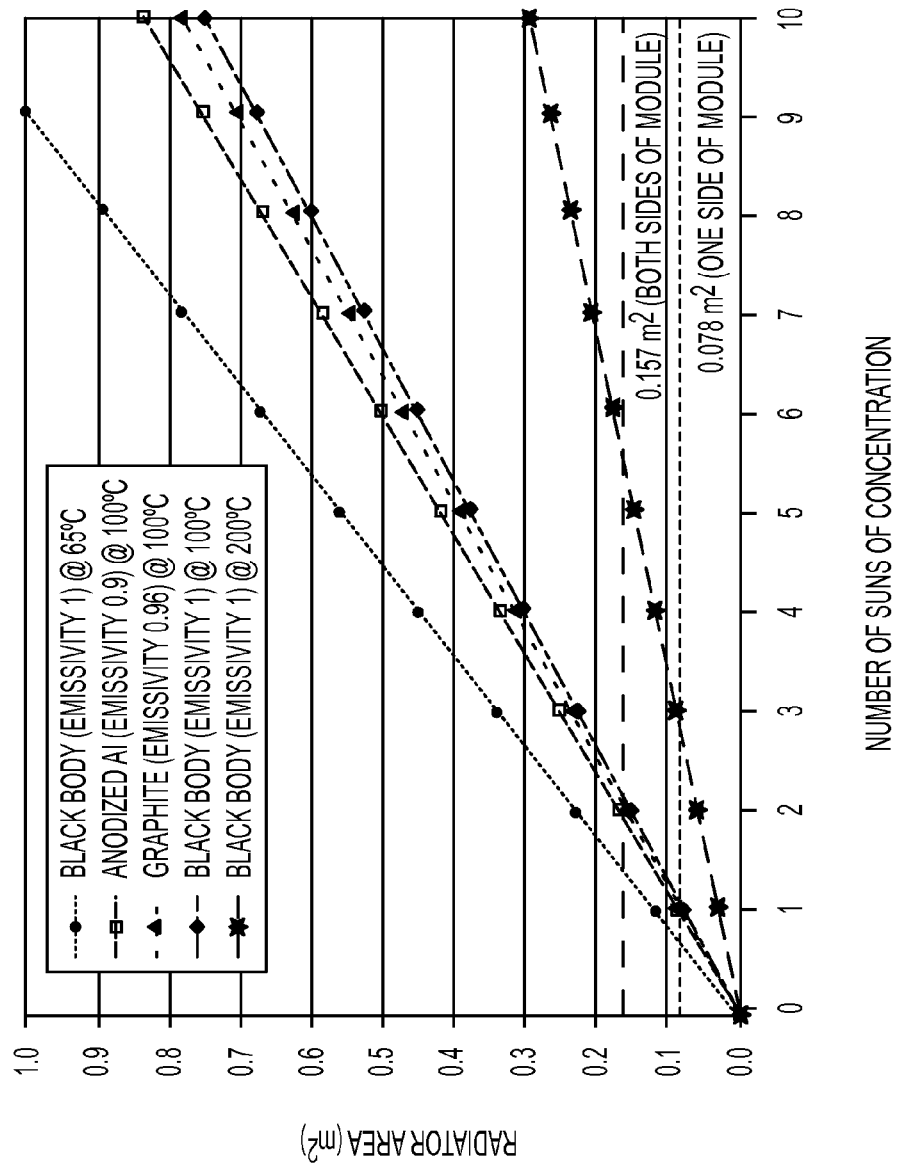
FIG. 4A is a graph showing the estimated radiator area required to maintain temperature equilibrium for a 28 cm square power conversion module at 23% efficiency.

The power conversion module also must dissipate heat power to avoid its overheating. A preliminary study of the thermal problem for the module shows some of the limitations imposed by the radiative heat transfer relation $P=\epsilon\sigma AT^4$, in which P is the heat power transmitted, $\epsilon$ is the emissivity of the material, $\sigma$ is the Stefan-Boltzmann constant, A is the radiating area, and T is the temperature. Assuming that a flat sandwich module can only use the top and bottom for radiating heat, since the module is expected to be positioned within an array of power conversion modules, bounds can be established by specifying the desired operating temperature. The sun's power flux in space in earth orbit is approximately 1400 W/m2. Assume a square sandwich module formed of four rows of seven cells with each cell measuring 4 centimeters by seven centimeters. By varying the sun concentration, and by considering different materials with different emissivities operating at different operating temperatures, the minimum radiator area for sufficient heat dissipation can be found. FIG. 4A is a graph showing the estimated radiator area required to maintain temperature equilibrium for a 28 cm square module at 23% efficiency, without considering the power distribution and conversion module efficiency and the antenna efficiency, which would slightly increase the required radiator area.

Figure 4B:
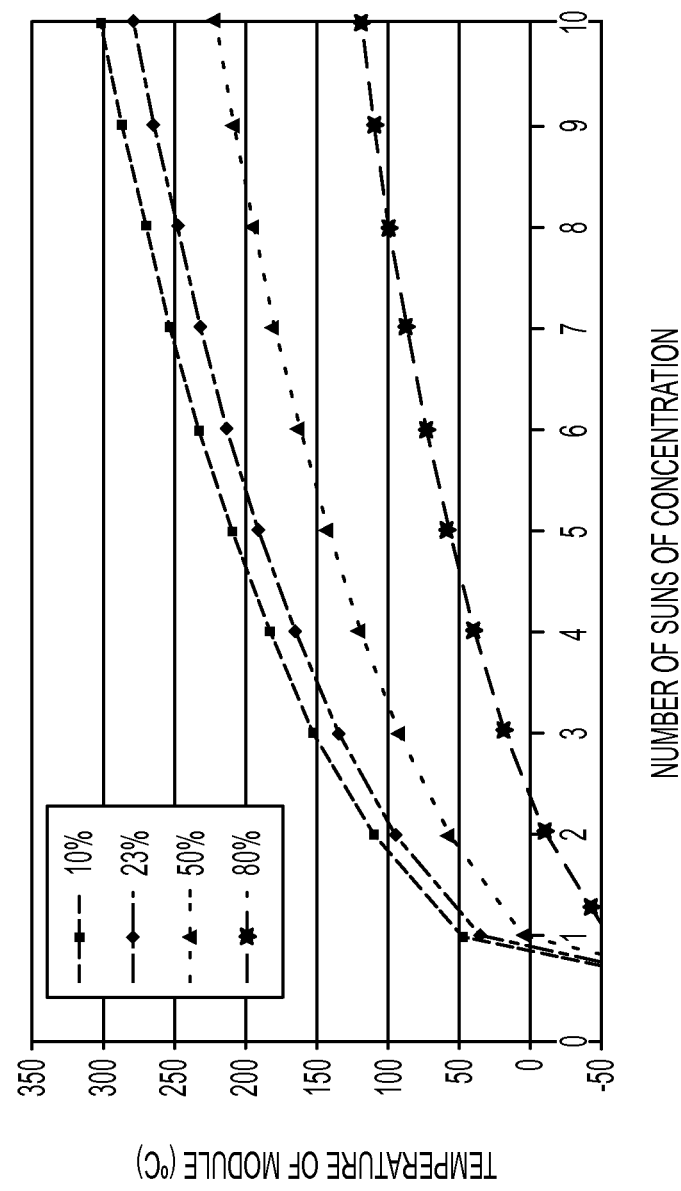
FIG. 4B is a graph showing the estimated temperature of a 28 centimeter by 28 centimeter power conversion module having both sides as black body radiators for four values of module efficiencies: 10%; 23%; 50%; and 80%.

FIG. 4B is a graph showing the estimated temperature of a 28 centimeter by 28 centimeter module having both sides as black body radiators for four values of module efficiencies: 10%; 23%; 50%; and 80%. The graph shows that in order to operate below 150 degrees C. with reasonable efficiencies, the sun concentration is limited to about three suns or below. This reduction in slope in the plots as sun concentration increases is due to the $T^4$ term in the radiative heat transfer relation.

Keeping the module temperature below about 150 degrees C. can help limit the efficiency degradation due to temperature of the photovoltaics and the DC-to-RF converters. In practice, individual efficiency degradations will be dependent on the temperature gradient across different parts of the module. It is noted that the FIG. 4B does not distinguish between DC-to-RF converter junction temperature, case temperature, solar array surface temperature, or differences in temperature between any parts of the module, and is intended as general illustration of the factors that affect the sandwich power conversion module operation.

The system of FIGS. 1 and 2 has several advantages over other space solar power systems and designs. For example, the system allows two-axis sun tracking while the microwave antennas remain pointing toward the earth. Photovoltaic and microwave systems are layered back-to-back in the power conversion module, eliminating long power cables and slip rings. The concentration of the solar power by the parabolic reflectors reduces the number of photovoltaic cells required. The waste heat can radiate from both faces of the power conversion module, so the available waste heat radiator area is twice the size of the solar incident area. However, the waste heat from the photovoltaic layer and the microwave devices can create high temperatures that can significantly reduce system efficiency, as discussed in the paragraphs above. In addition, the structure necessary to maintain the power conversion module in a flat configuration has mass that must be launched into orbit, and the system must be assembled in orbit.

FIG. 5A-5E illustrate a space solar power system with a power conversion module that has improved thermal performance and other benefits.

As in the example of FIG. 1, the off-axis parabolic reflectors 42 and 44 in the system are configured to receive solar energy and reflect the solar energy toward the secondary reflector module 50. The solar concentration factor can be determined based on an analysis of the module efficiencies and the heat dissipation area, and reflectors and the secondary reflectors have a concentration factor between about 3:1 and 5:1. The secondary reflector module 50, shown in cross section in FIG. 5A, reflects the concentrated solar energy toward the power conversion module 60. The power conversion module 60 converts the solar energy into RF energy and transmits it toward the earth.

In this example, the power conversion module 60 is configured as an open-topped stepped-conical structure, with the cone's axis aligned so the open top of the module faces toward the secondary reflector module and the cone of the module points toward the earth.

Figure 5A:
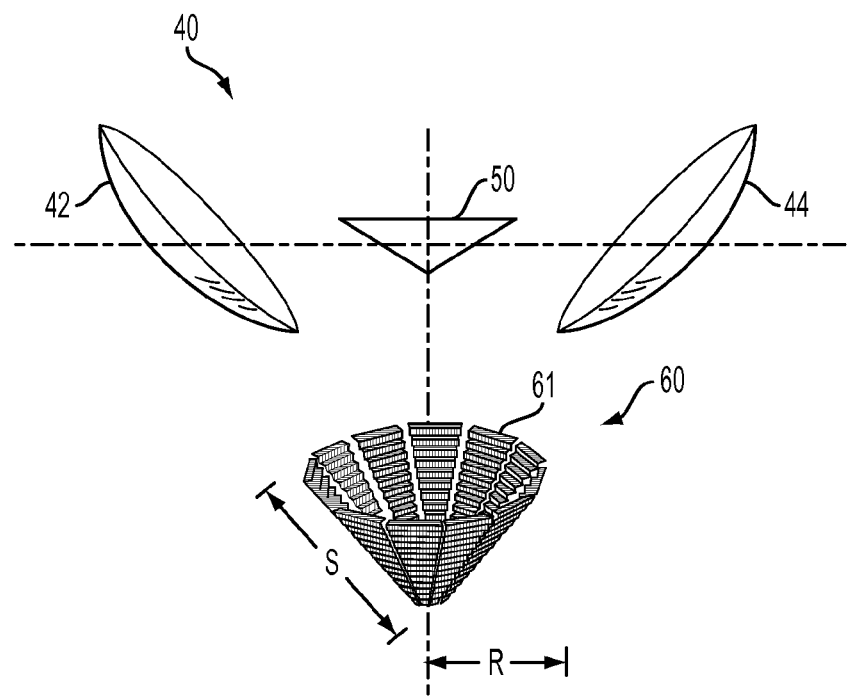
FIGS. 5A-5E illustrates a space solar power system with a conical power conversion module.
Figure 5B:
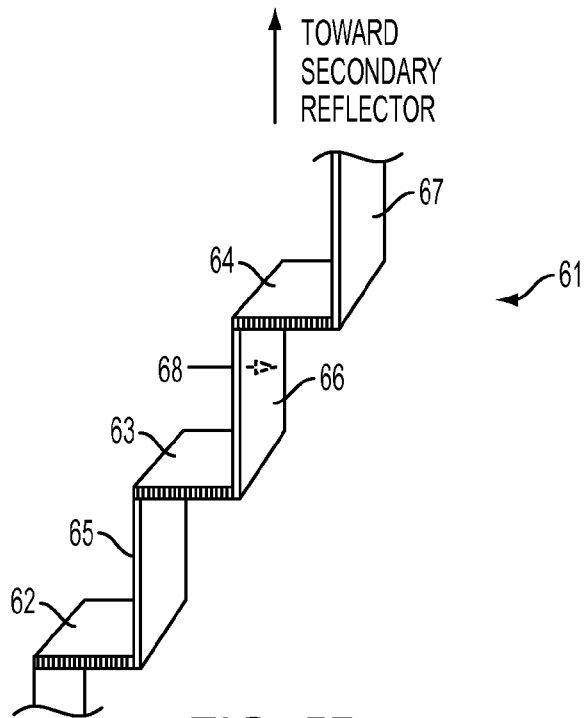
Figure 5C:
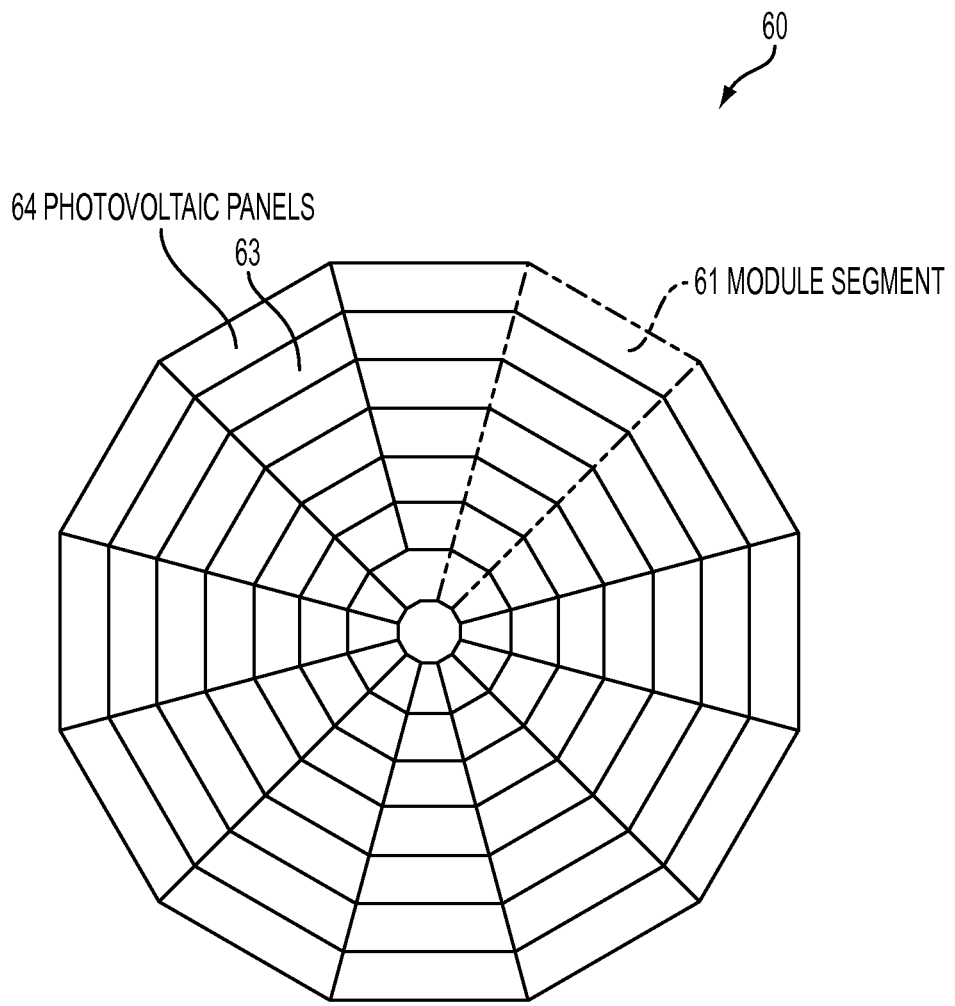

FIG. 5C shows the top view of the power conversion module 60. The power conversion module 60 includes several pie or wedge shaped sections, e.g., section 61, each section being joined to the two adjacent wedge shaped sections at the side edges of the section. In the example shown in FIGS. 5A and 5C, twelve sections wedge shaped sections are shown. FIG. 5B illustrates a partial cross sectional view of one of the wedge shaped sections 61, which are also known as "stepped" sidewalls.

The stepped sidewalls 61 include a number of sidewall radiators, shown in FIG. 5B as elements 65, 66, and 67. As shown in FIGS. 5A and 5B, the sidewall radiators are the vertical elements in the conical power conversion module 60, in that in operation, they are each aligned generally along an axis pointing toward the secondary reflector unit 50. The horizontal elements 62, 63, and 64 in the stepped sidewalls 61 of the power conversion module 60 include the photovoltaic multijunction cells.

The horizontal photovoltaic sections 62, 63, and 64 and the sidewall radiators 65, 66, 67 are joined together end-to-end to form a stair step shape as shown in FIG. 5B.

Figure 5D:
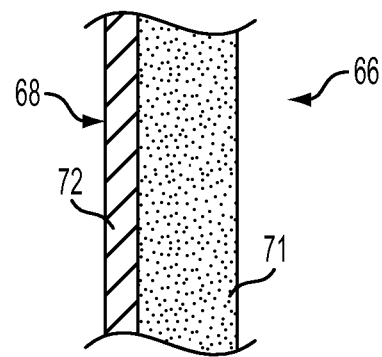
Figure 5E:
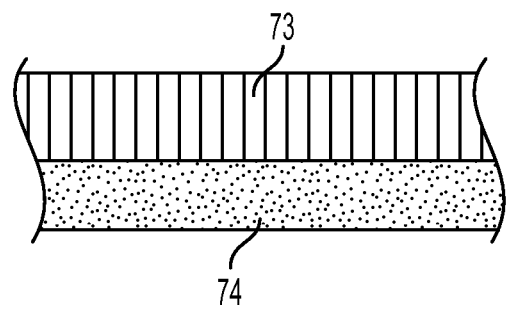

The interior surfaces of the sidewall radiators, which face toward the center of the conical power conversion module, can have a reflective surface 68, so that all solar energy entering the conical power conversion module 60 from an off-axis direction will be reflected to one of the photovoltaic panels, while waste radiant heat from the photovoltaic panels will exit the module. The reflective surface can be a reflective coating layer 72 deposited or formed on or otherwise attached to the graphite composite material 71 of the sidewall radiator 66, as shown in FIG. 5D. The horizontal photovoltaic sections comprise photovoltaic cells 73 on the upper or interior surfaces facing toward the secondary reflector, and a structural support member 74 on the opposite surface facing away from the secondary reflector, as shown in FIG. 5E. Preferably, the sidewall radiators and the underlying support structure 74 for the photovoltaic multijunction cells are formed of a highly thermally conductive material, such as a graphite composite.

Note that the terms horizontal and vertical are used for convenience in describing the drawing figures, and are not intended to limit the system to a particular attitude. Further, while the illustration of FIG. 5B shows the system having an approximately 90 degree angle between the sidewall radiator elements and the photovoltaic array elements, this angle may be greater or smaller.

Figure 6A:
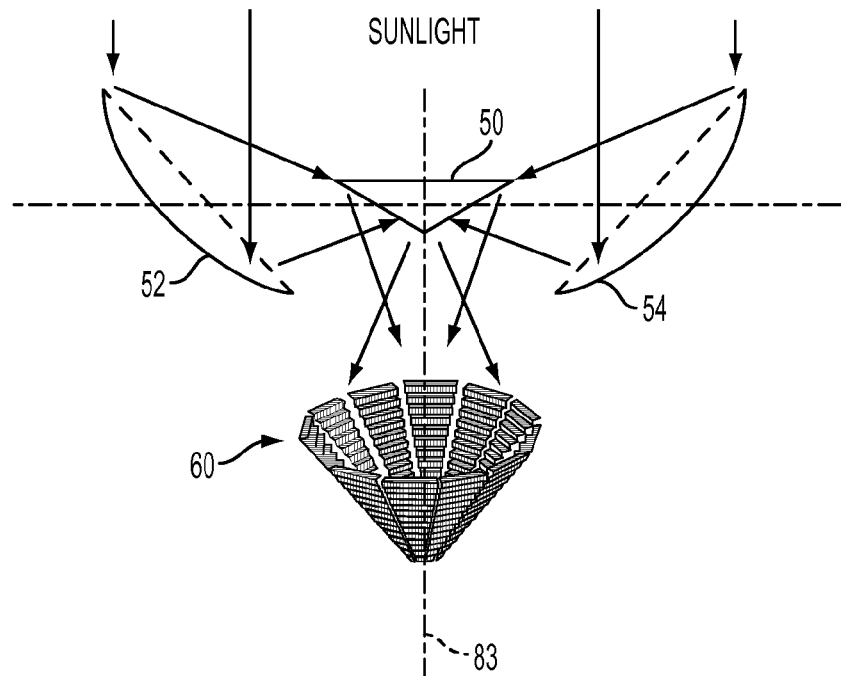
FIGS. 6A and 6B show the space solar power system of FIGS. 5A-5E in operation.
Figure 6B:
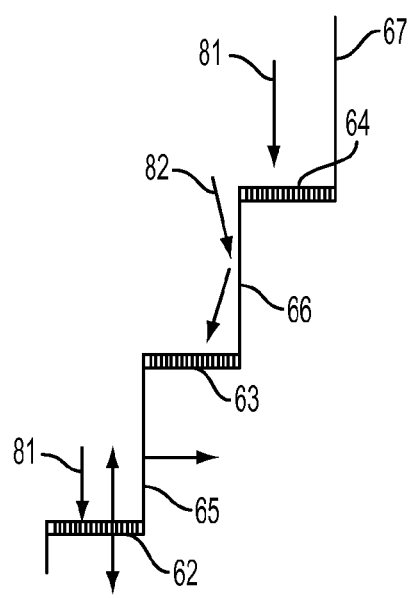

FIGS. 6A and 6B show the system 40 in operation, with sunlight being reflected by the sun-tracking off-axis parabolic reflectors toward the secondary reflector, and the secondary reflector's reflective surfaces transmitting the sunlight to the power conversion module array 60. FIG. 6B shows the sunlight 81 from the secondary reflector striking the photovoltaic cells 64, and sunlight 82 entering the power conversion module at an angle from the azimuthal axis 83 and striking the reflective surfaces of the sidewall radiator 66, where it is reflected toward the photovoltaic cell 63. The sidewall radiators 65, 66, 67, in addition to reflecting sunlight toward the photovoltaic cells 62, 63, 64, also radiate waste heat from the exterior graphite surface of the sidewall radiators. The photovoltaic cell horizontal sections radiate waste heat from both surfaces.

The stepped sidewall power conversion module 60 described herein has several features that improve the cost-effectiveness of space solar power systems. First, the configuration of the power conversion module provides improved thermal control, allowing the photovoltaic collection system and the microwave conversion system operate at lower temperatures, which increases their efficiency. In particular, the vertical components (sidewall radiators) greatly increase the radiative surface area of the power conversion module. If the power conversion module array 60 has a radius R approximately equal to the radius of the sandwich module array 30, and the power conversion module's side length S equals 3 times the radius R, the total radiator area of the power conversion module will be almost four times that of the two sides of the sandwich cell. A system design that includes both state of the art photovoltaic cells and a conical stepped-sidewall photovoltaic module is believed to lower the operating temperature from 130C (for an equivalently sized sandwich cell) to about 60 degrees C., and to increase the system's operating efficiency from about 21% to about 26%.

Second, the system's novel structural support system greatly reduces the mass of the SSP, resulting in a reduced cost transport the system into orbit. For example, each of the wedge-shaped stepped sidewall systems can be formed of lightweight panels, with the photovoltaic panels affixed only to the upper surface of the horizontal panels. The panels can be formed of graphite or another lightweight, strong, radiative material.

Third, the modular design aspect of the system allows for compact stowage in launch vehicles and robotic assembly on orbit.

The elements of the system are configured to result in the power conversion module transmitting a low-loss microwave beam. A low loss beam can be a Gaussian beam, such that there are low sidelobes, as discussed in W. C. Brown, IEEE Transactions on Microwave Theory and Techniques, Vol. 40, No. 6, June 1992, pp. 1239-1250.

Figure 7B:
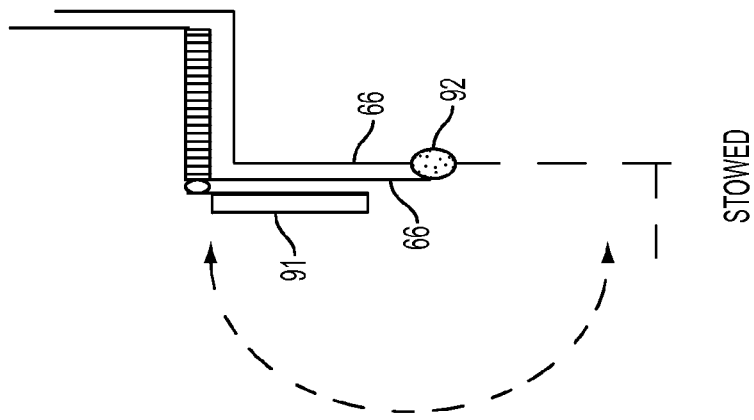
FIGS. 7A and 7B show the DC-to-RF and antenna elements as arranged in the conical power conversion module shown in of FIGS. 5A-5E.
Figure 7A:
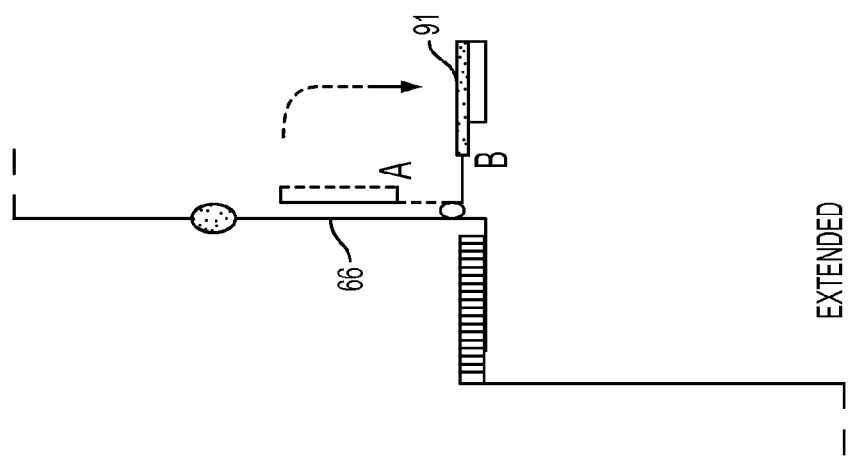

FIGS. 7A and 7B show one way in which the DC-to-RF and antenna elements are arranged into the conical power conversion module 60. In this example, the microwave electronics and antenna components are not integrated into a sandwich-type power conversion module, but instead are attached as spring-loaded, fold-out conversion and antenna element 91 that contains both the DC-to-RF microwave electronics and the antenna for transmitting the microwave power toward the ground station. As shown in FIG. 7A, each of the sidewall radiators is connected to a spring-loaded, fold-out conversion and antenna element 91. The conversion and antenna element 91 is folded against the sidewall radiator 66 during launch of the solar power system, as shown by the dotted lines and the element number 91A and unfolds to its deployed position when the system is deployed for operation. The hinge itself can be formed of a thermally conductive material, or, if it is located near the midpoint in the radiator 66, it can be formed of a non-thermally conductive material.

The sidewall power conversion system can also include at least one level of hinged sidewall radiators 66. A hinge 92 in the sidewall radiator 66 allows the wedge shaped section to be fold onto itself for compact stowage during launch (as shown in FIG. 7B) and then extended into its unfolded deployed state (FIG. 7A) when the system is deployed for operation.

FIGS. 8A and 8B illustrate another alternative for the interior design of the conical power conversion module. FIGS. 8A and 8B show one stair-step level of the stepped sidewall segment of the conical power conversion unit. In this example, the photovoltaic panel 101 is mounted vertically on the sidewall radiator panel 102. A deployable reflector panel 103 folds out from the sidewall radiator panel 102 at a hinge 104, and in operation, the deployable reflector panel 103 redirects the incoming sunlight to the photovoltaic panel. The microwave electronics and antenna unit 106 and a radiator are positioned on the horizontal reflector plates 105 and isolated from the sidewall radiator panels 102 by non-conducting hinges 107. A thin film reflector 108 can extend from the tip of the fold-out reflector down to the adjacent photovoltaic radiator at the next level of the stair-step segment. All interior vertical surfaces are reflective, with the exception of the photovoltaic panel surface. Both the reflector plates and the vertical structures are preferably formed of lightweight thermally conductive material suitable for use as a radiator, such as a graphite composite material, so both the vertical plates 102 and the horizontal reflector panels 105 act as radiators to eliminate waste heat.

The reflector panels are preferably positioned at an acute angle to the vertical radiator plates at an angle sufficiently large to receive and reflect a large fraction of the incident sunlight from the secondary reflector.

FIG. 8B shows the stowed configuration of the wedge-shaped segment. The segment folds at each stair step, with hinges at each joint between each vertical sidewall radiator panel and each horizontal radiator panel 105, and between each vertical sidewall radiator panel and each reflector panel 103. Each of the reflector panels and radiator panels folds up against the adjacent vertical structure for stowage.

The components in this configuration, while shown only in cross section in FIGS. 8A and 8B for clarity, preferably extend across the width of the wedge-shaped segment.

It is noted that the system in FIGS. 8A and 8B has a slight loss from the photovoltaic array's reflector panel (estimated at 96% reflective). In comparison, the FIGS. 7A and 7B configuration has less loss, however, it may be challenging to implement the FIG. 7A and 7B design for including highly conductive graphite fibers in the right-angle junctions in the radiator panels.

The conical power conversion modules of FIGS. 7A and 7B and FIGS. 8A and 8B can have several advantages over other designs for space solar power arrays. For example, the novel method for radiating waste heat from PV and microwave devices can allow the system to operate at reduced temperatures, increasing system efficiency and power generation potential. The two separate radiator systems, one for the photovoltaic system and one for the microwave electronics and antenna unit, reduce the operating temperature of each. These two features provide much better thermal performance than the sandwich power conversion module. The light weight and modular design allow the system to be built to very large dimensions in space.

The embodiments described herein include a conical power conversion module. Alternatively, the power conversion module can have another shape, such as a hemisphere or a parabolic conic section, with the open end of the shape and the concave interior surface facing toward the secondary reflector. For example, the power conversion module can be shaped in a way to ensure that pattern of light from the secondary reflector will be spread out across the photovoltaic cells in a way that forms the microwave beam in a desired pattern. Planar power conversion modules, with an array of sandwich cells carried on a planar graphite structural support and radiator, are also envisioned, with the hinged fold-out microwave electronic and antenna units, and/or fold-out radiator elements, such as those shown in FIG. 7A, 7B, 8A, and 8B.

It is to be understood, however, that even though numerous characteristics and advantages of the present invention have been set forth in the foregoing description, together with details of the structure and function of the invention, the disclosure is illustrative only, and changes may be made in detail, especially in matters of shape, size and arrangement of parts within the principles of the invention to the full extent indicated by the broad general meaning of the terms in which the appended claims are expressed.

What is claimed as new and desired to be protected by Letters Patent of the United States is:

1. A power conversion module for a solar power system comprising:
    a plurality of module segments, each module segment having a plurality of parallel rows of photovoltaic cells, a plurality of sidewall radiators, each of the sidewall radiators positioned between adjacent rows of the photovoltaic cells, a plurality of DC-to-RF electronics conversion units configured for receiving DC power from the photovoltaic cells and converting the DC power to microwave power, and at least one antenna for transmitting the microwave power through free space toward a remote location, the rows of photovoltaic cells and the sidewall radiators forming a stairstep shape, each of the module segments having a wide end, a narrower end, and two opposed edges extending between the wide end and the narrower end,
    wherein the power conversion module has a concave shape formed by joining the plurality of module segments with wide ends together and narrower ends together.

2. The system of claim 1, wherein the interior facing surfaces of the sidewall radiators have a reflective surface.

3. The power conversion module of claim 1, wherein the power conversion module has a conical shape.

4. The power conversion module of claim 1, wherein each sidewall radiator comprises a graphite epoxy thermal radiator material layer.

5. The power conversion module of claim 1, wherein the sidewall radiators are normal to the rows of photovoltaic cells.

6. The power conversion module of claim 1, wherein each of the sidewall radiators forms an acute angle with the plane of an adjacent row of photovoltaic cells.

7. The solar power conversion module of claim 1, wherein the concave shape has a central axis, and the solar power conversion module is rotationally symmetric around the axis.

8. The solar power conversion module of claim 7, wherein the concave shape is a cone.

9. The power conversion module of claim 7, in combination with:
- at least one primary reflector; and
- a secondary reflector arranged optically between the primary reflector and the power conversion module for receiving sunlight from the primary reflector and reflecting the sunlight toward the power conversion module.

10. The power conversion module of claim 9, wherein a central axis of the power conversion module lies along a line extending between the secondary reflector and the remote location.

11. The power conversion module of claim 1, in combination with:
- at least one primary reflector; and
- a secondary reflector arranged optically between the primary reflector and the power conversion module for receiving sunlight from the primary reflector and reflecting the sunlight toward the power conversion module.

12. The power conversion module of claim 11, wherein the rows of photovoltaic cells are inside the concave shape of the power conversion module, facing toward the secondary reflector.

* * * * *